US012772746B2

(12) United States Patent
van der Straten et al.

(10) Patent No.: US 12,772,746 B2
(45) Date of Patent: Oct. 20, 2026

(54) MULTI-TAPERED MRAM DEVICE STRUCTURE

(71) Applicant: International Business Machines Corporation, Armonk, NY (US)

(72) Inventors: Oscar van der Straten, Guilderland Center, NY (US); Chih-Chao Yang, Glenmont, NY (US); Ashim Dutta, Clifton Park, NY (US); Wu-Chang Tsai, Albany, NY (US); Ailian Zhao, Slingerlands, NY (US); Pei-I Wang, Clifton Park, NY (US); Shravana Kumar Katakam, Lehi, UT (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 18/483,864

(22) Filed: Oct. 10, 2023

(65) Prior Publication Data

US 2025/0120324 A1 Apr. 10, 2025

(51) Int. Cl.

*H10N 50/01* (2023.01)
*G11C 11/16* (2006.01)
*H10B 61/00* (2023.01)
*H10N 50/10* (2023.01)
*H10N 50/80* (2023.01)

(52) U.S. Cl.

CPC ........... *H10N 50/80* (2023.02); *G11C 11/161* (2013.01); *H10B 61/00* (2023.02); *H10N 50/01* (2023.02); *H10N 50/10* (2023.02)

(58) Field of Classification Search

CPC ........ H10N 50/00; H10N 50/01; H10N 50/10; H10N 50/20; H10N 50/80

See application file for complete search history.

(56) References Cited

U.S. PATENT DOCUMENTS

| | | | | |
|---|---|---|---|---|
| 6,965,138 | B2 * | 11/2005 | Nakajima | H10N 50/10 257/E27.005 |
| 8,339,841 | B2 | 12/2012 | Iwayama | |
| 8,455,965 | B2 | 6/2013 | Li et al. | |
| 8,644,063 | B2 | 2/2014 | Li et al. | |
| 8,796,795 | B2 | 8/2014 | Satoh et al. | |
| 9,231,193 | B2 * | 1/2016 | Iwayama | H10N 50/01 |
| 10,559,751 | B1 | 2/2020 | Yang et al. | |
| 10,770,654 | B2 | 9/2020 | Yang et al. | |
| 11,062,876 | B2 * | 7/2021 | Niwa | H01J 37/28 |
| 11,114,606 | B2 | 9/2021 | Reznicek et al. | |
| 11,545,617 | B2 | 1/2023 | Chern | |
| 11,991,932 | B2 * | 5/2024 | Chang | G11C 11/161 |
| 2013/0157385 | A1 * | 6/2013 | Jung | G11C 11/161 257/E43.006 |
| 2015/0056722 | A1 | 2/2015 | Li et al. | |
| 2021/0005807 | A1 * | 1/2021 | Kwon | H10B 61/00 |
| 2022/0393101 | A1 * | 12/2022 | Lee | H10N 50/80 |
| 2022/0416158 | A1 | 12/2022 | Loy et al. | |
| 2024/0389468 | A1 | 11/2024 | Van Der Straten et al. | |
| 2024/0389469 | A1 | 11/2024 | Van Der Straten et al. | |

* cited by examiner

*Primary Examiner* — Eric A. Ward

(74) *Attorney, Agent, or Firm* — Harrity & Harrity, LLP

(57) ABSTRACT

A magnetoresistive random access memory (MRAM) includes a pillar structure having a bottom electrode and a magnetic tunnel junction (MTJ) having a reference layer, a free layer and a tunnel barrier disposed between the reference layer and the free layer. The MTJ is disposed on the bottom electrode. A top electrode is disposed on the MTJ. The top electrode includes two or more tiers wherein each tier successively includes a smaller footprint.

20 Claims, 12 Drawing Sheets

MULTI-TAPERED MRAM DEVICE STRUCTURE

BACKGROUND

The present invention generally relates to magnetic memory devices, and more particularly to a magnetic memory device having a recessed sidewall profile that improves dielectric isolation and reduces void-risk.

For high performance magnetoresistive random access memory (MRAM) devices based on perpendicular magnetic tunnel junction (MTJ) structures, well-defined interfaces and interface control are important factors. MTJ structures may include a Co-based synthetic anti-ferromagnet (SAF), a CoFeB-based reference layer, a MgO-based tunnel barrier, a CoFeB-based free layer, and cap layers containing, e.g., Ta and/or Ru. Embedded MTJ structures are usually formed by subtractive patterning of blanket MTJ stacks into pillars between two metal levels. After MTJ stack patterning, inter-pillar spaces are filled with an interlevel dielectric (ILD) to enable connection to back-end-of-line (BEOL) wiring by a top contact level. ILD gapfill between inter-pillar spaces presents a significant challenge since the presence of voids in the ILD between the pillars can lead to shorts.

SUMMARY

In accordance with an embodiment of the present invention, a magnetoresistive random access memory (MRAM) includes a pillar structure having a bottom electrode and a magnetic tunnel junction (MTJ) having a reference layer, a free layer and a tunnel barrier disposed between the reference layer and the free layer. The MTJ is disposed on the bottom electrode. A top electrode is disposed on the MTJ. The top electrode includes two or more tiers wherein each tier successively includes a smaller footprint.

In accordance with an embodiment of the present invention, a MRAM includes a pillar structure. The pillar structure includes a bottom electrode, a magnetic tunnel junction (MTJ) having a reference layer, a free layer and a tunnel barrier disposed between the reference layer and the free layer, the MTJ disposed on the bottom electrode and a top electrode. The top electrode is disposed on the MTJ. The top electrode includes three tiers wherein each tier is centered over the bottom electrode and successively includes a smaller footprint than a tier upon which each tier rests.

In accordance with an embodiment of the present invention, a method for making a MRAM includes forming a bottom electrode and a magnetic tunnel junction stack; forming at least two conductive material layers for a top electrode on the magnetic tunnel junction stack and patterning the at least two conductive material layers using a hard mask to form a stack of layers. At least a top tier of the stack of conductive layers for the top electrode is laterally recessed to reduce a footprint of the top tier relative to a tier below the top tier. The hard mask is removed, and a pillar structure with a magnetic tunnel junction is formed by etching the magnetic junction stack in accordance with the top electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
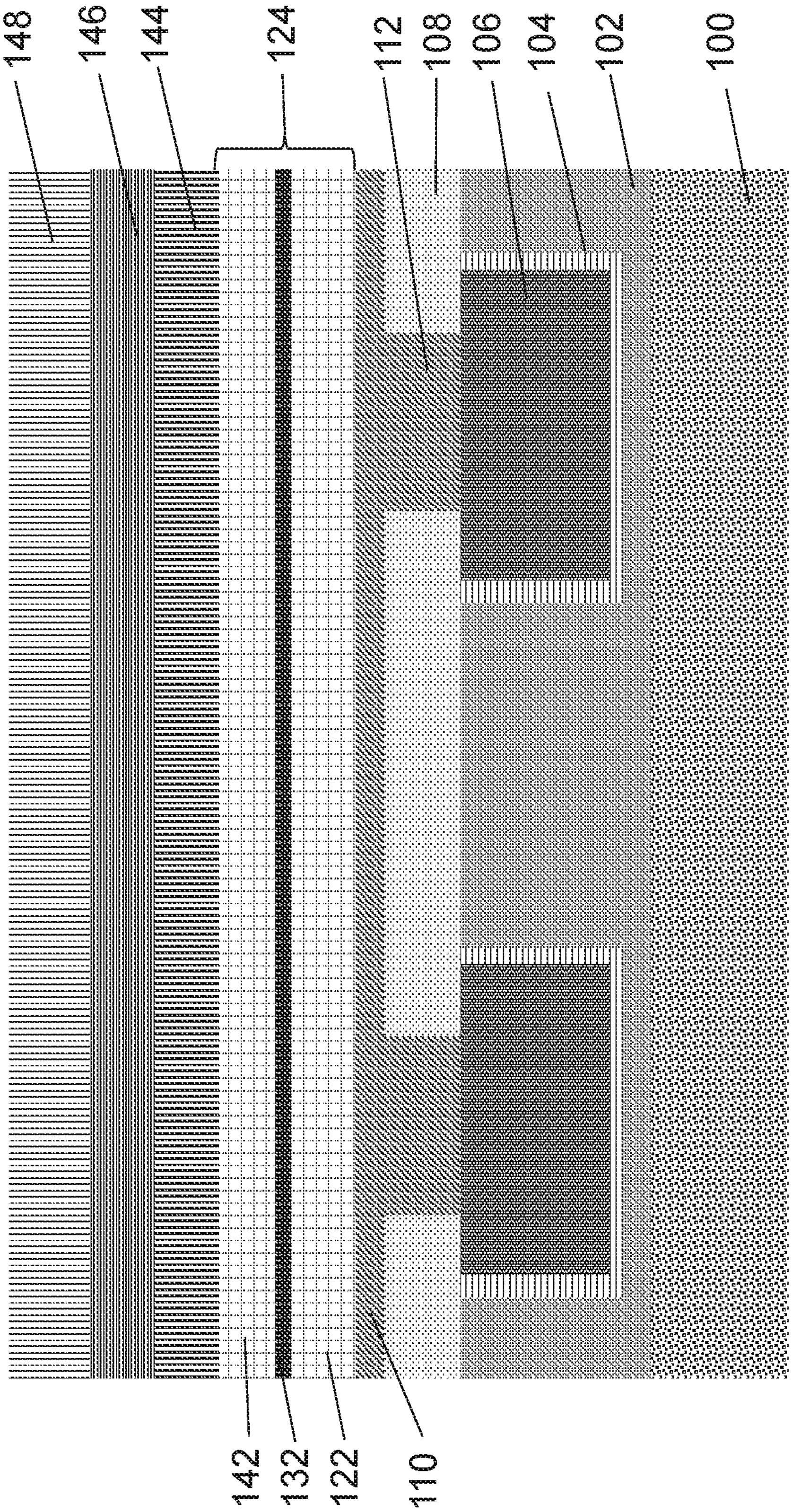
FIG. 1 is a cross-sectional view showing a magnetic junction stack formed over a bottom electrode metal and showing a top electrode stack including three layers in accordance with an embodiment of the present invention.

Embodiments of the present invention include magnetic devices having recessed sidewall profile features that improve dielectric isolation between structures to reduce or eliminate shorts between magnetic devices. In one embodiment, the magnetic device includes a magnetoresistive random-access memory (MRAM) device. The MRAM device or cell can include a vertical construction that has a stack or pillar of conductive features. The stack or pillar includes a magnetic tunnel junction (MTJ), a top electrode and a bottom electrode. In accordance with useful embodiments, the top electrode is fabricated into a stacked structure having multiple tiers where each tier includes a smaller width or footprint than a previous tier on which it rests.

In conventional systems, during interlevel dielectric fill between pillars, gaps may form as a result of incompletely filling in the regions adjacent to the pillars. In some instances conductive material can find its way into or along these gaps. Such conductive material can result in shorts between structures within each pillar.

In accordance with embodiments of the present invention, the risk of ILD gaps between pillars or pillar structures is reduced. In addition, the pillar structures are constructed to improve isolation between the pillar structures by employing recessed portions of the top electrode. In one embodiment, the top electrode includes multiple recessed tiers. These tiers can be shaped by, e.g., wet etch methods to enable top electrode lateral recess.

In one embodiment, the top electrode includes a trilayer structure having three tiers. In one embodiment, the tiers includes tapered portions to form a multi-tapered top electrode structure for a MRAM device which enables void-free dielectric gapfill between MRAM pillars. Embodiments of the multi-tapered MRAM device structure can include top electrode materials such as, e.g., TaN, WCN, MON, TiN, and Mo. In useful embodiments, the trilayer top electrode (TE) can include three tiers (TE1/TE2/TE3), which can include, e.g., TaN/WCN/TIN, WN/MoN/Mo, or any other combination of these and other materials.

In an embodiment, the trilayer top electrode includes tapers in all top electrode tiers, where the taper includes a taper angle ranging from about 15 to about 30 degrees. In other embodiments, a dielectric encapsulation layer (such as, e.g., SiN) can be employed to conformally cover all sidewalls of the trilayer top electrode. Dry etch methods such as, e.g., a reactive ion etch (RIE), or ion beam etch (IBE) can be employed for taper formation or top corner rounding of the tiers of the top electrode. Taper height or corner rounding can be controlled through the use by deposition and removal of sacrificial layers such as, e.g., spin-on glass (SOG) or amorphous C.

It should be understood that while embodiments of the present invention describe a trilayer recessed tier top electrode, other embodiments can include a two-tiered top electrode, a four-tiered top electrode, and so on. The resulting structure permits interlevel dielectric (ILD) gapfilling without voids since a wider opening is provided by the recessed top electrodes for the formation of the ILD. In this way, top contacts can be formed to the top electrode without shorts. The features in accordance with embodiments of the present invention exhibit no ILD voids between pillar structures since only low aspect ratio features are filled with ILD. By employing a deposition of ILD material on a tapered or stepped pillar structure at the final stages of the fabrication process, ILD material is assured to avoid gaps or inconsistencies in the ILD fill. With little or no chance of voids, there is little or no chance that these voids would fill up with conductive material from top electrode or other formation processes. Instead, a highly consistent ILD layer is formed that completely isolates adjacent MRAM pillar structures or other structures in the device. Embodiments having ILD materials can include $SiO_2$-based and SiCOH-based dielectrics, although other materials and combinations of materials can be employed.

In addition, with the recessed sidewall profile and improved ILD gapfill, the scalability of MRAM or other memory elements can be extended due to void-free ILD gapfill between devices. In other words, more densely packed devices and higher reliability can be realized. Embedded MRAM performance is also improved due to a great reduction in the possibility of top contact shorts.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to “one embodiment” or “an embodiment”, as well as other variations thereof, means that a particular feature, structure, characteristic, and so forth described in connection with the embodiment is included in at least one embodiment. Thus, the appearances of the phrase “in one embodiment” or “in an embodiment”, as well any other variations, appearing in various places throughout the specification are not necessarily all referring to the same embodiment.

It is to be appreciated that the use of any of the following “/”, “and/or”, and “at least one of”, for example, in the cases of “A/B”, “A and/or B” and “at least one of A and B”, is intended to encompass the selection of the first listed option (A) only, or the selection of the second listed option (B) only, or the selection of both options (A and B). As a further example, in the cases of “A, B, and/or C” and “at least one of A, B, and C”, such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms “a,” “an” and “the” are intended to include the plural forms as well, unless the context clearly indicates otherwise. It will be further understood that the terms “comprises,” “comprising.” “includes” and/or “including,” when used herein, specify the presence of stated features, integers, steps, operations, elements and/or components, but do not preclude the presence or addition of one or more other features, integers, steps, operations, elements, components and/or groups thereof.

Spatially relative terms, such as “beneath,” “below,” “lower,” “above,” “upper,” and the like, can be used herein for ease of description to describe one element’s or feature’s relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as “below” or “beneath” other elements or features would then be oriented “above” the other elements or features. Thus, the term “below” can encompass both an orientation of above and below. The device can be otherwise oriented (rotated 90 degrees or at other orientations), and the spatially relative descriptors used herein can be interpreted accordingly. In addition, it will also be understood that when a layer is referred to as being “between” two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, methods for manufacturing a magnetoresistive random access memory (MRAM) cell are shown in accordance with embodiments of the present invention. The MRAM cell includes a substrate 100 having multiple layers on which the MRAM cell will be fabricated. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

While the substrate 100 can include a single semiconductor layer, the substrate 100 can also be comprised of a plurality of different layers including one or more front end of line (FEOL) layers, one or more middle of the line layers (MOL) and/or one more back end of line (BEOL) layers. These layers may, in turn, include one or more active device layers, one or more dielectric layers, one or more metal layers, etc.

A dielectric layer 102, such as, e.g., an interlevel dielectric layer (ILD) is formed on the substrate 100. The dielectric layer 102 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 102 can be deposited using chemical vapor deposition (CVD), although other deposition methods can be employed.

The deposited dielectric layer 102 is then patterned and etched to form a hole or trench. The trench is then lined with a diffusion barrier or metal liner 104. The diffusion barrier 104 can be conformally deposited over the topography of the dielectric layer 102. The diffusion barrier 104 can be deposited by an atomic layer deposition (ALD) process, physical vapor deposition (PVD) or a CVD process, although other processes may be employed. The diffusion barrier 104 can include a material such as, e.g., TiN, TaN, TiWN, TaWN, HfN or the like.

A conductive fill is performed to fill the trenches on top of the diffusion barrier 104. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., CVD, plasma enhanced CVD (PECVD), ALD or any other suitable deposition method.

A planarization process is performed, e.g., a chemical mechanical polish (CMP) to reduce the conductive fill to a surface of the dielectric layer 102 to form conductor 106. This CMP process also removes the diffusion barrier 104 from the surface of the dielectric layer 102. The conductor 106 can include a metal line, a via or any other suitable conductive structure.

A dielectric cap layer 108 is deposited over the conductor 106 and dielectric layer 102. The dielectric cap layer 108 preferably includes a material that is selectively removeable relative to the dielectric layer 102. While the same materials and process used for the dielectric layer 102 can be employed for dielectric cap layer 108, dielectric cap layer 108 includes a different chemistry to enable the selectivity. For example, if dielectric layer 102 includes a silicon oxide, dielectric cap layer 108 can include a silicon nitride to be selectively etchable with respect to dielectric layer 102. The dielectric cap layer 108 includes a reduced thickness relative to the dielectric layer 102. For example, dielectric cap layer 108 is thick enough to protect the top portion of the conductor 106 during subsequent processing.

The dielectric cap layer 108 is patterned to open up the dielectric cap layer 108 to expose the conductor 106. The dielectric cap layer 108 can be patterned using lithographic patterning techniques to pattern an etch mask followed by an etching process, such as a reactive ion etch (RIE) or ion beam etch (IBE). The etch process can be selective to the materials of the conductor 106.

A conductive deposition 110 is performed to further fill over the conductors 106. The conductive deposition 110 can include materials, such as, e.g., TaN, TaWN and alloys or combinations of these and other conductive materials. In a particularly useful embodiment, the conductive deposition 110 includes TaN. The conductive deposition 110 can be formed using a deposition method, such as, e.g., CVD, PECVD, ALD, PVD or any other suitable conformal deposition method. A portion of the conductive deposition 110 will form a bottom electrode (BE) 112.

A ferromagnetic layer 122 is deposited. The ferromagnetic layer 122 can include, for example, a composition including cobalt (Co), iron (Fe), nickel (Ni), boron (B), or any combination thereof. In one example, the ferromagnetic layer 122 includes a reference layer (RL) with a fixed magnetization that can be formed of, e.g., CoFeB or CoFe. The ferromagnetic layer 122 can be formed by a deposition process such as, for example, PVD, CVD or PECVD.

A tunnel barrier dielectric layer (or tunnel barrier) 132 is formed on the reference layer 126. The tunnel barrier dielectric layer 132 is the site of tunnel magnetoresistance (TMR), which is the magnetoresistive effect that occurs in a MTJ structure. The tunnel barrier dielectric layer 132 can be formed of a non-magnetic, insulating material such as magnesium oxide (MgO), aluminum oxide ($Al_2O_3$), tantalum oxide ($Ta_2O_5$) or titanium oxide ($TiO_2$) or any other suitable materials. The tunnel barrier dielectric layer 132 may have a thickness ranging from about 0.5 nm to about 1 nm. The tunnel barrier dielectric layer 132 can be formed by a deposition process such as, for example, PVD, CVD or ALD.

A ferromagnetic layer 142 is deposited on the tunnel barrier 132. The ferromagnetic layer 142 can include, for example, a composition including cobalt (Co), iron (Fe), nickel (Ni), boron (B), or any combination thereof. In one example, the ferromagnetic layer 142 includes free magnetization layer (FL) and can be formed of, e.g., CoFeB or CoFe. The ferromagnetic layer 142 can be formed by a deposition process such as, for example, PVD, CVD or PECVD. The ferromagnetic layer 122, tunnel barrier 32 and the ferromagnetic layer 142 make up a MTJ stack 124.

Conductive material layers 144, 146 and 148 can be formed by deposition processes such as, for example, sputtering, CVD, or PECVD. The conductive material layers 144, 146 and 148 can include Ta, TaN, Ti, TiN, Ru, RuN, RuTa, RuTaN, Co, CoWP, CoN, Mo, MoN, W, WN, WCN and alloys or combinations of these and other conductive materials. In one embodiment of the present application, conductive material layers 144, 146 and 148 are employed in forming a three-tiered top electrode (TE) and can include materials such as, e.g., TaN, WCN, MON, TiN, and Mo that have different etch selectivities. In useful embodiments, the top electrode (TE) can include three tiers (TE1/TE2/TE3), which can, respectively include, e.g., TaN/WCN/TIN, WN/MoN/Mo, or any other combination of materials that include different etch selectivities such that each tier can be laterally etched without significant impact on the other tiers.

Figure 2:
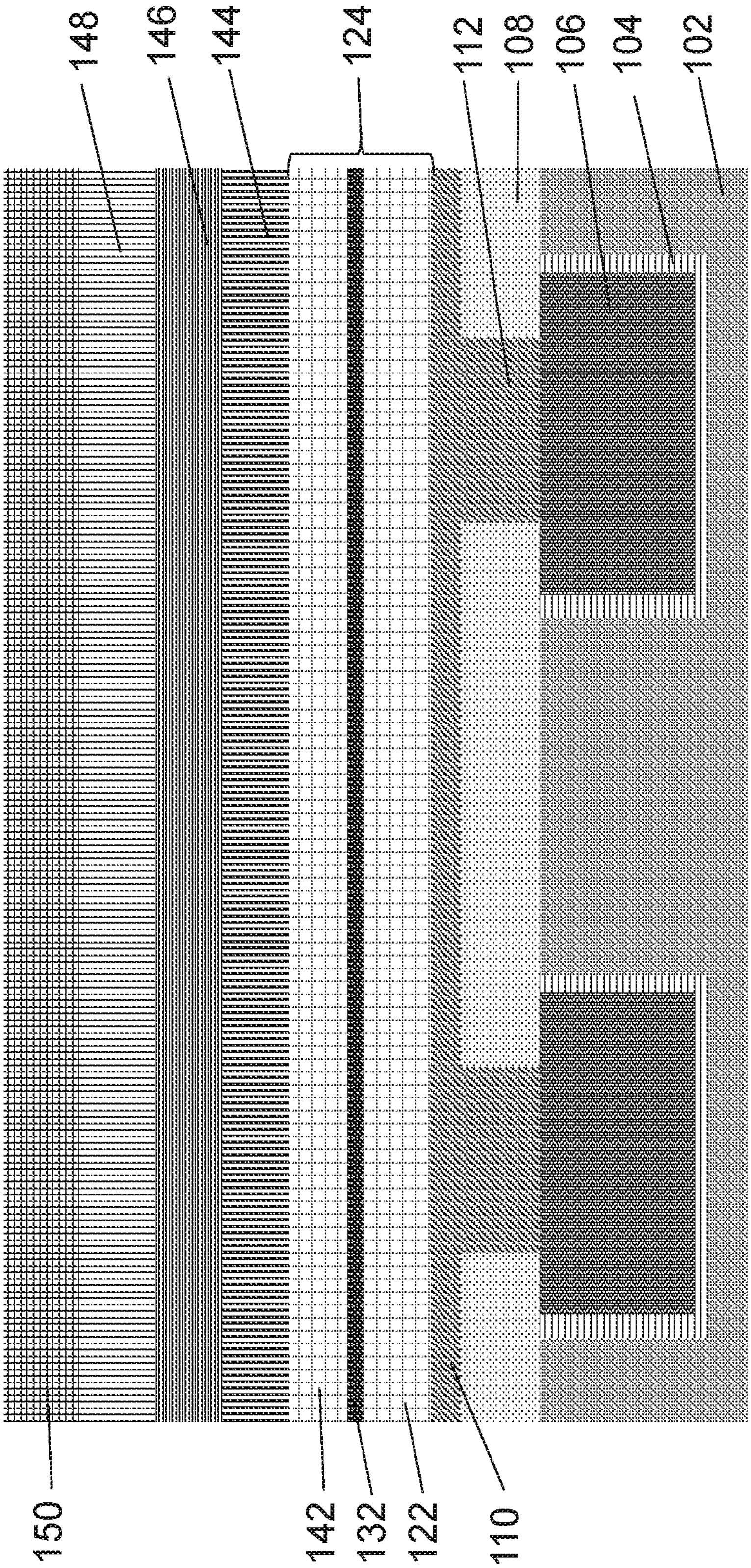
FIG. 2 is a cross-sectional view showing a hard mask layer formed over the top electrode stack in accordance with an embodiment of the present invention.

Referring to FIG. 2, in one embodiment, a hard mask 150 includes a hard mask material that may be formed by blanket depositing a layer of the hard mask material over the conductive layer 148.

Figure 3:
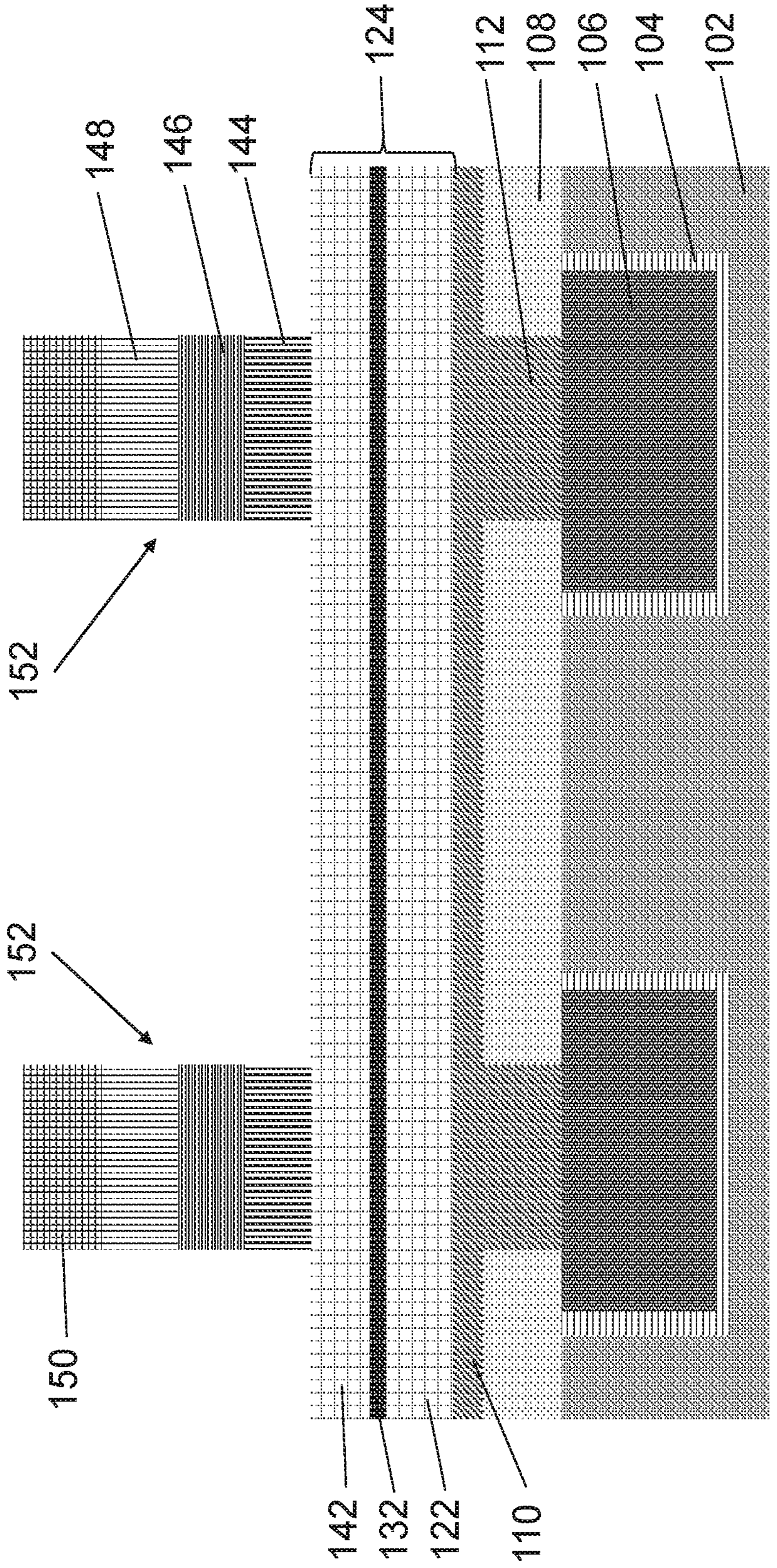
FIG. 3 is a cross-sectional view showing the hard mask layer patterned and the top electrode stack etched to form a stack of layers having a same footprint in each stack in accordance with an embodiment of the present invention.

Referring to FIG. 3, hard mask 150 is patterned, e.g., by providing a patterned photoresist on top of the layer of hard mask material, and then etching the layer of hard mask material to provide the patterned hard mask 150, which protects a portion of the conductive material layers 144, 146 and 148. A patterned photoresist can be produced by applying a blanket photoresist layer to the surface of the hard mask material and exposing the photoresist layer to a pattern of radiation, and then developing the pattern into the photoresist layer utilizing resist developer. The hard mask 150 is patterned to form pillar structures 152 for MTJ cells. The hard mask 150 is centered over the bottom electrode 112.

Etching of the exposed portion in accordance with the hard mask 150 may include an etch chemistry for removing the conductive material layers 144, 146, 148 with a high selectivity relative to the hard mask 150. In one embodiment, the etch process may be an anisotropic etch process, such as RIE or IBE.

Figure 4:
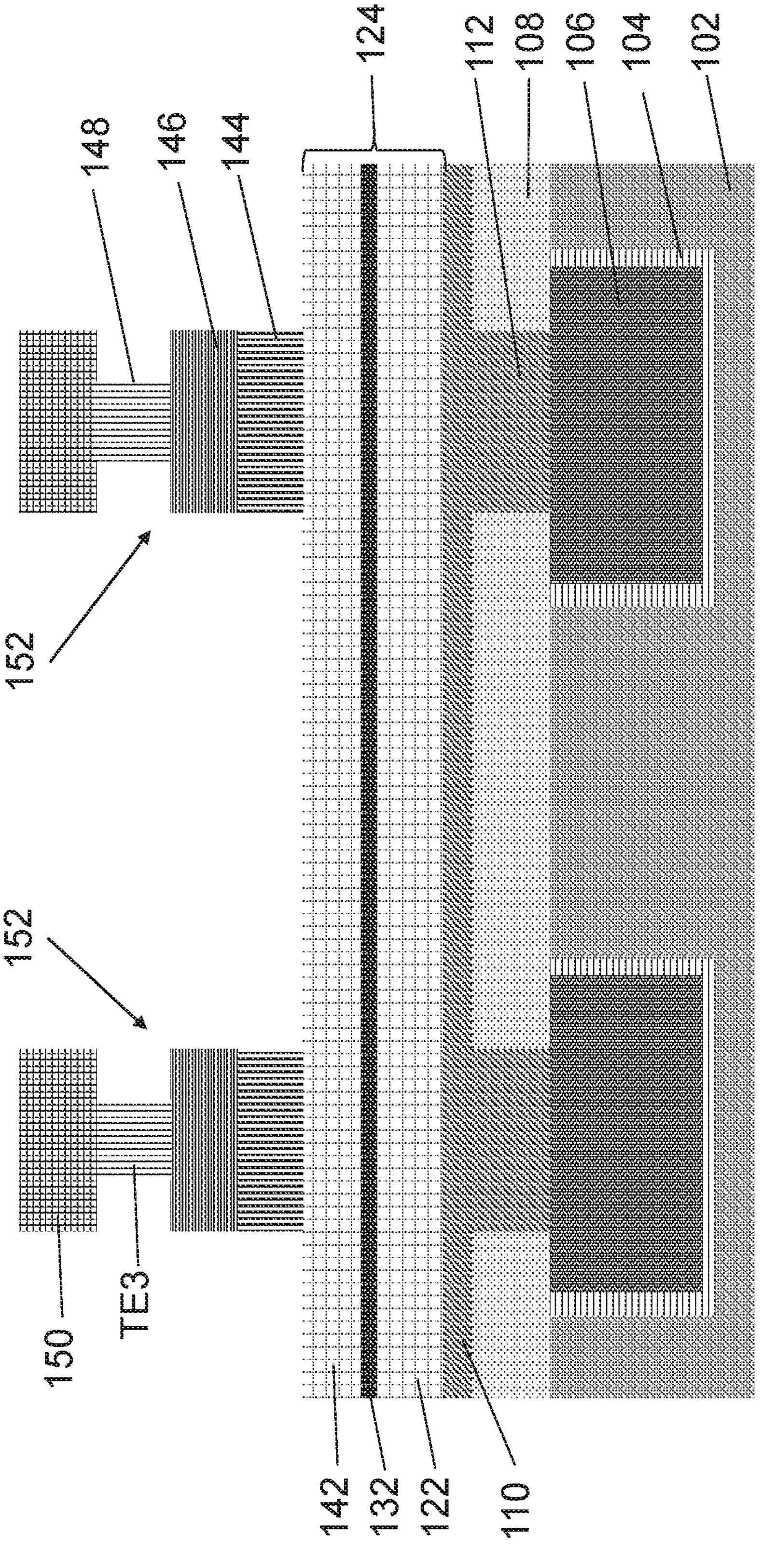
FIG. 4 is a cross-sectional view showing a top tier of a top electrode laterally recessed to reduce its footprint in accordance with an embodiment of the present invention.

Referring to FIG. 4, a wet etch process is performed to selectively etch conductive material layer 148 relative to the conductive material layers 144, 146 and ferromagnetic layer 142. In some embodiments, oxidizing wet chemicals such as $H_2O_2$ or acids such as, HF, can be employed. The wet etch chemistry depends on the selection of materials for conductive material layers 144, 146 and 148. In one example, conductive material layer 144 includes TiN, conductive material layer 146 includes WCN and conductive material layer 148 includes TaN. Other materials and combinations are also contemplated. The conductive material layer 148 is etched to laterally reduce a top electrode (TE3) tier. Conductive material layers 144, 146 remain significantly unchanged by the wet etch.

Figure 5:
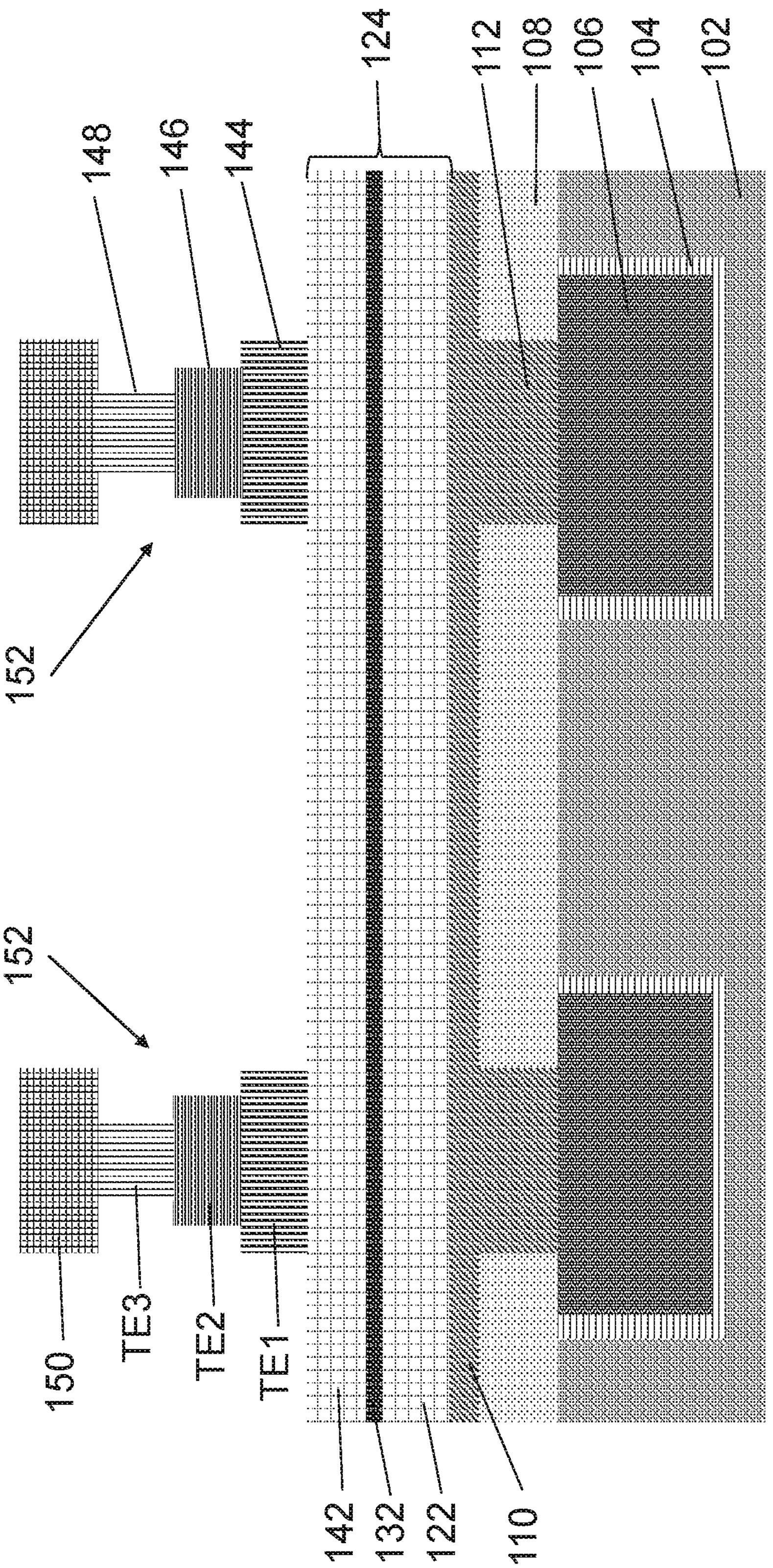
FIG. 5 is a cross-sectional view showing a middle tier of the top electrode laterally recessed to reduce its footprint in accordance with an embodiment of the present invention.

Referring to FIG. 5, a wet etch process is performed to selectively etch conductive material layer 146 relative to the conductive material layers 144, 148 and ferromagnetic layer 142. The wet etch chemistry depends on the selection of materials for conductive material layers 144, 146 and 148. The conductive material layer 146 is etched to laterally reduce a middle electrode (TE2) tier. The top electrode (TE1) tier remains its initial size as conductive material layers 144, 148 remain significantly unchanged by the wet etch of conductive material 146.

The top electrode includes at least two tiers and each tier successively has a smaller footprint than the tier on which it is formed. In other words, tier TE3 (a top tier) has a smaller footprint than tier TE2 (a middle tier), and tier (TE2) has a smaller footprint than tier TE1 (lower tier). It should be noted that the tiers (TE1, TE2, and TE3) are preferably centered over the bottom electrode 112 and a tunnel junction to be formed. In one embodiment, tiers TE3 and TE2 are shifted to one side (e.g., off-center) of TE1 as needed.

In another embodiment, a single etch can be performed to etch tier TE3 and tier TE2. This can include providing materials with different etch rates. For example, tier TE3 can include a material with a higher etch rate than tier TE2. In this way, both tiers TE3 and TE2 can be exposed to a single etch process that laterally recesses both to form different lateral recesses for each. Tier TE1 can be protected from the etch process by forming a protective dielectric layer (similar to sacrificial layer 160 (FIG. 6) or a material can be selected for tier TE1 that is not etched by the single etch process.

Figure 6:
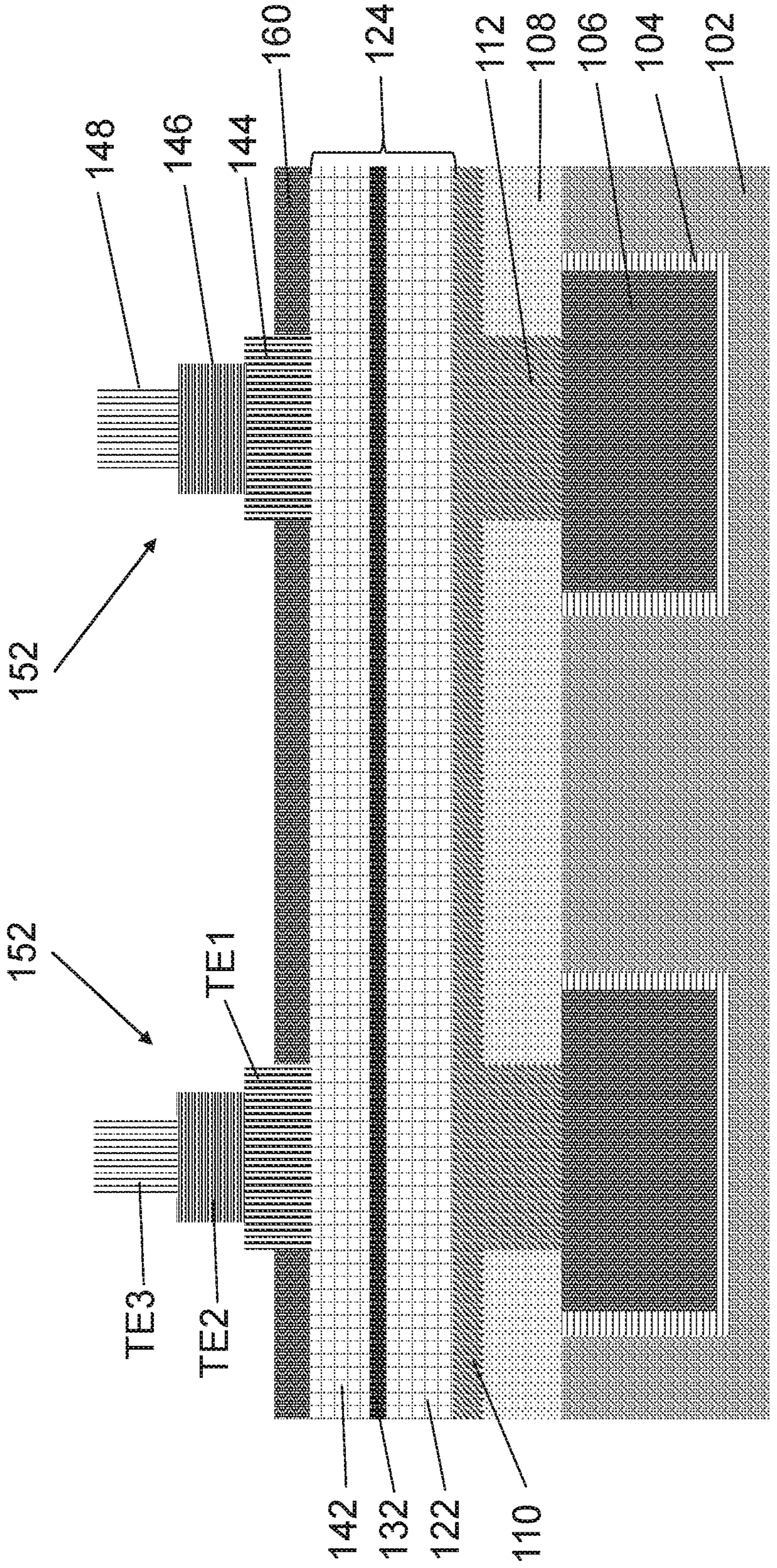
FIG. 6 is a cross-sectional view showing the hard mask removed in accordance with an embodiment of the present invention.

Referring to FIG. 6, the hard mask 150 is removed. This can be completed using an etch selective to the ferromagnetic layer 142. In another embodiment, the hard mask 150 can be removed using a planarization process, such as, e.g., chemical mechanical polishing (CMP).

A sacrificial dielectric layer 160 is formed on the ferromagnetic layer 142. The sacrificial dielectric layer 160 can include any suitable material. In one embodiment, e.g., the sacrificial dielectric layer 160 includes an amorphous carbon layer. In another embodiment, the sacrificial dielectric layer 160 can include a spun on glass. The sacrificial dielectric layer 160 is then etched by an etch-back process to achieve a desired height relative to the TE1 tier. The dielectric layer 160 can be deposited by, e.g., spin-on deposition, CVD, plasma enhanced CVD (PECVD) or any suitable deposition methods.

Figure 7:
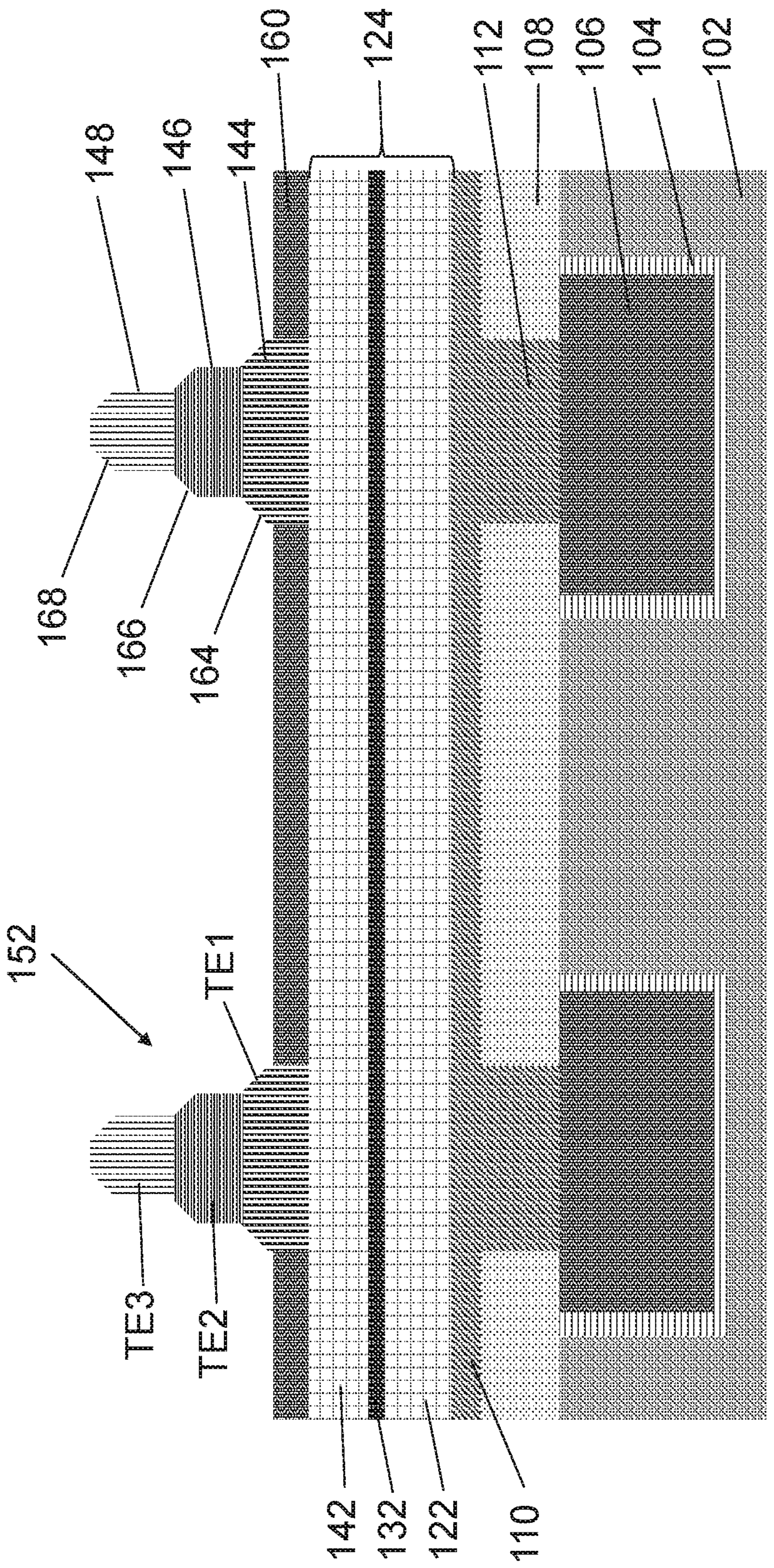
FIG. 7 is a cross-sectional view showing corners on the tiers of the top etched to round the corners or form tapers in accordance with an embodiment of the present invention.

Referring to FIG. 7, an anisotropic etch is performed with the sacrificial layer 160 protecting the ferromagnetic layer 142. The anisotropic etch can include, e.g., a reactive ion etch (RIE) although other etch processes may be employed, e.g., ion beam etch (IBE). The anisotropic etch is performed to form features 164, 166, 168 on top electrode tiers TE1, TE2, TE3. Features 164, 166, 168 can include chamfers or rounded corners. In one embodiment, the features 164, 166, 168 include a taper angle of between about 15 and about 30 degrees with a vertical reference. The laterally recessed and tapered top electrode tiers TE1, TE2 and TE3 are gradually smaller with height. A top-most portion of each pillar structure 152 is reduced in size. In this way, there is little or no chance of voids forming when a dielectric material is deposited to cover the pillar structures 152 in later steps. Therefore, gapfill concern is greatly reduced between later formed device pillar structures. In addition, softening edges of the features 164, 166, 168 by rounding or tapering corners of the top electrodes TE1, TE2, TE3 reduces the likelihood of shorts since electrical charge will be better distributed rather than having sharper features that could function as pathways for electrical discharge or shorting.

The sacrificial dielectric layer 160 is then removed by an etch process. The sacrificial dielectric layer 160 is etched away selectively to the top electrode tiers TE1, TE2, TE3 and the ferromagnetic layers 142.

Figure 8:
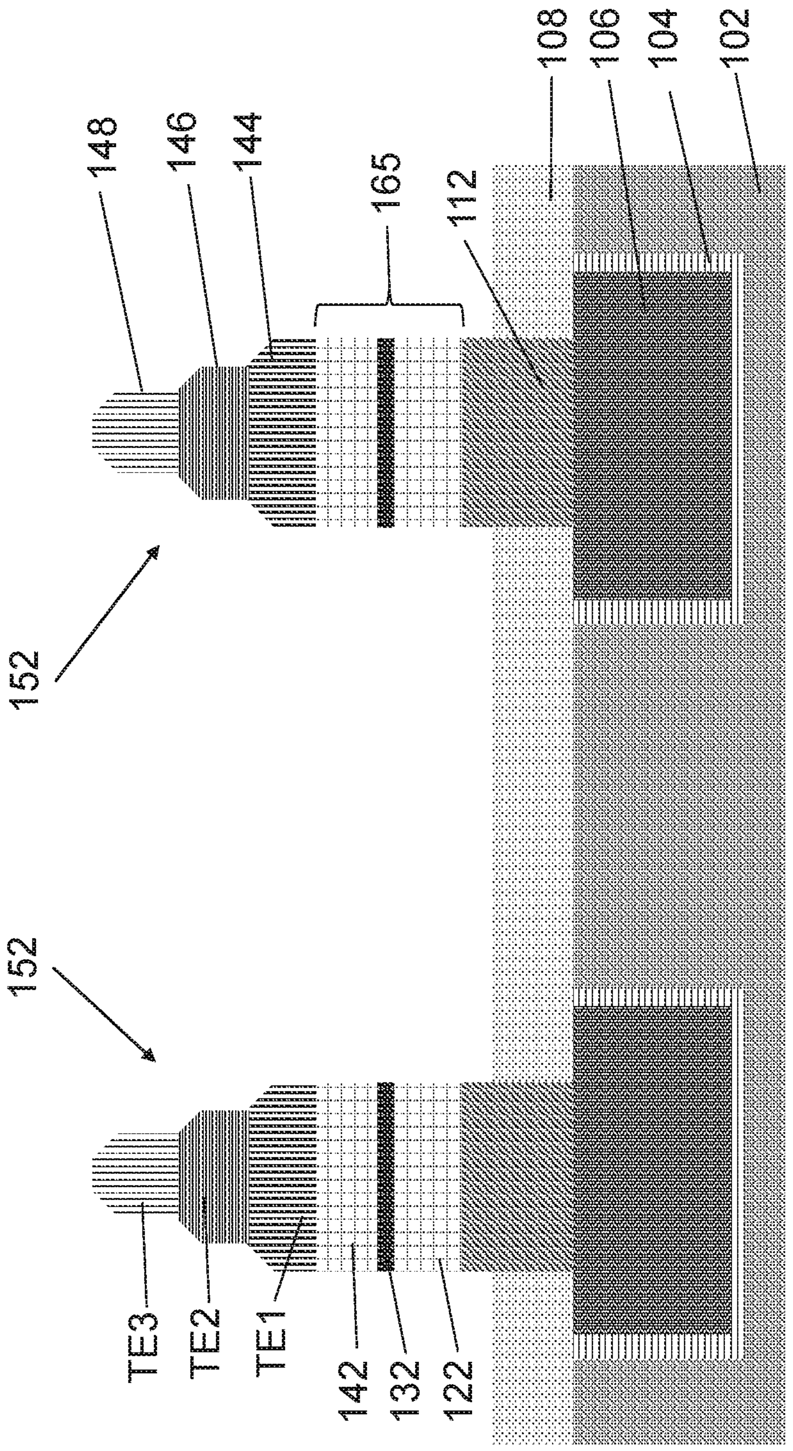
FIG. 8 is a cross-sectional view showing the magnetic junction stack and the bottom electrode metal etched to form pillar structures in accordance with the top electrode in accordance with an embodiment of the present invention.

Referring to FIG. 8, an MTJ stack is patterned using an etch process to form an MTJ 165. The etch process uses the top electrode tiers TE1, TE2, TE3 as an etch mask to pattern the ferromagnetic layer 142, the tunnel barrier 132 and the ferromagnetic layer 122. In addition, the conductive deposition 110 is removed from a surface of the dielectric cap layer 108 to form bottom electrodes 112. In one embodiment, the etch process may be an anisotropic etch process, such as, e.g., RIE or IBE.

Figure 9:
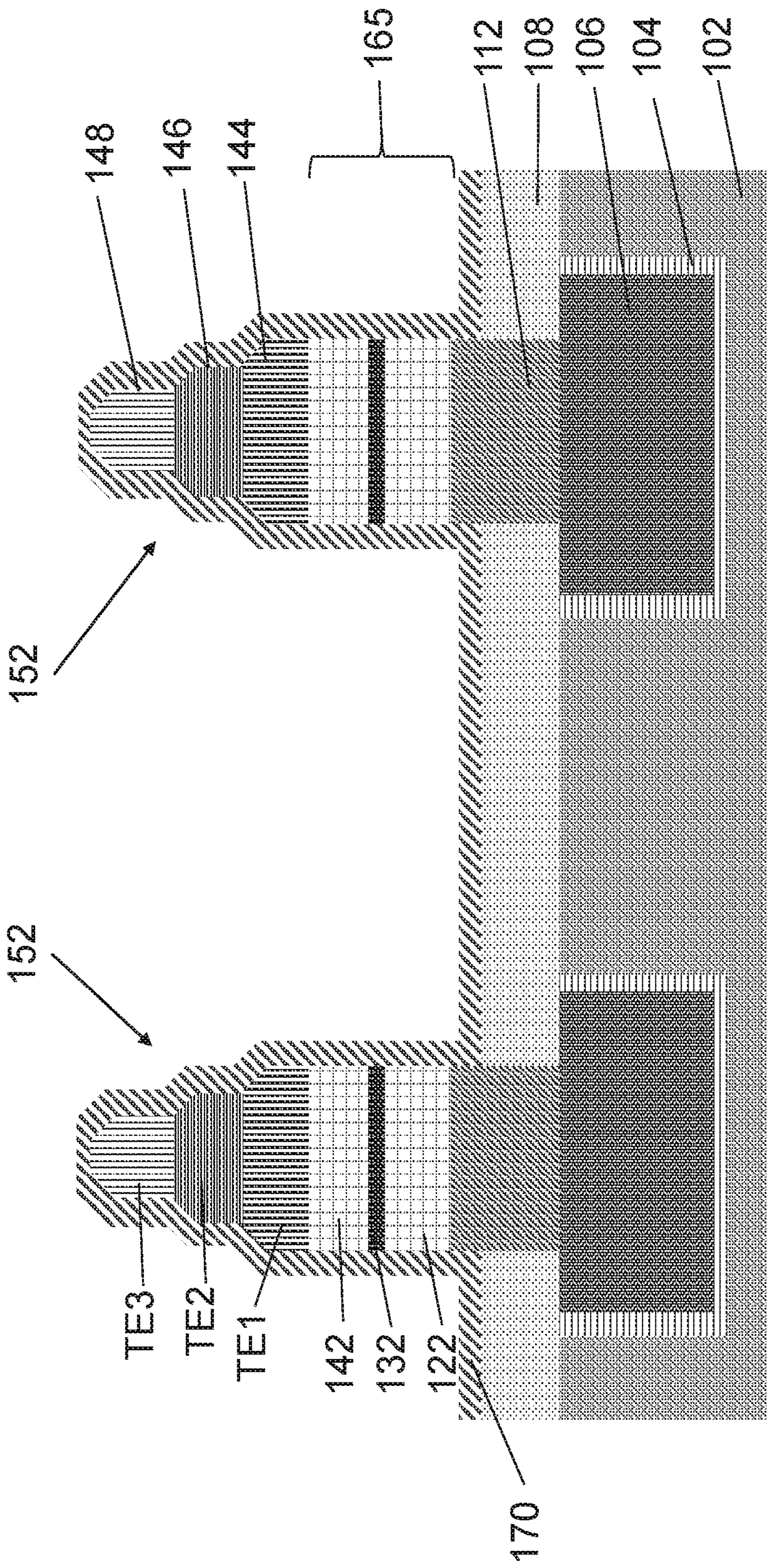
FIG. 9 is a cross-sectional view showing a dielectric encapsulation layer conformally formed over the pillar structures in accordance with an embodiment of the present invention.

Referring to FIG. 9, a dielectric encapsulation layer 170 is formed over the top electrode tiers TE1, TE2, TE3, on sidewalls of the MTJ 165 and over dielectric cap layer 108. The dielectric encapsulation layer 170 will be employed to protect sidewalls of the pillar structures 152, which include the top electrode tiers TE1, TE2, TE3, the MTJ 165 and bottom electrode 112. The dielectric encapsulation layer 170 can be formed by depositing a conformal layer of dielectric material, such as an oxide, nitride or oxynitride. In particularly useful embodiments, the dielectric encapsulation layer 170 can include SiN, SiNC or other suitable materials. The dielectric encapsulation layer 170 can be deposited using, e.g., a CVD method.

Figure 10:
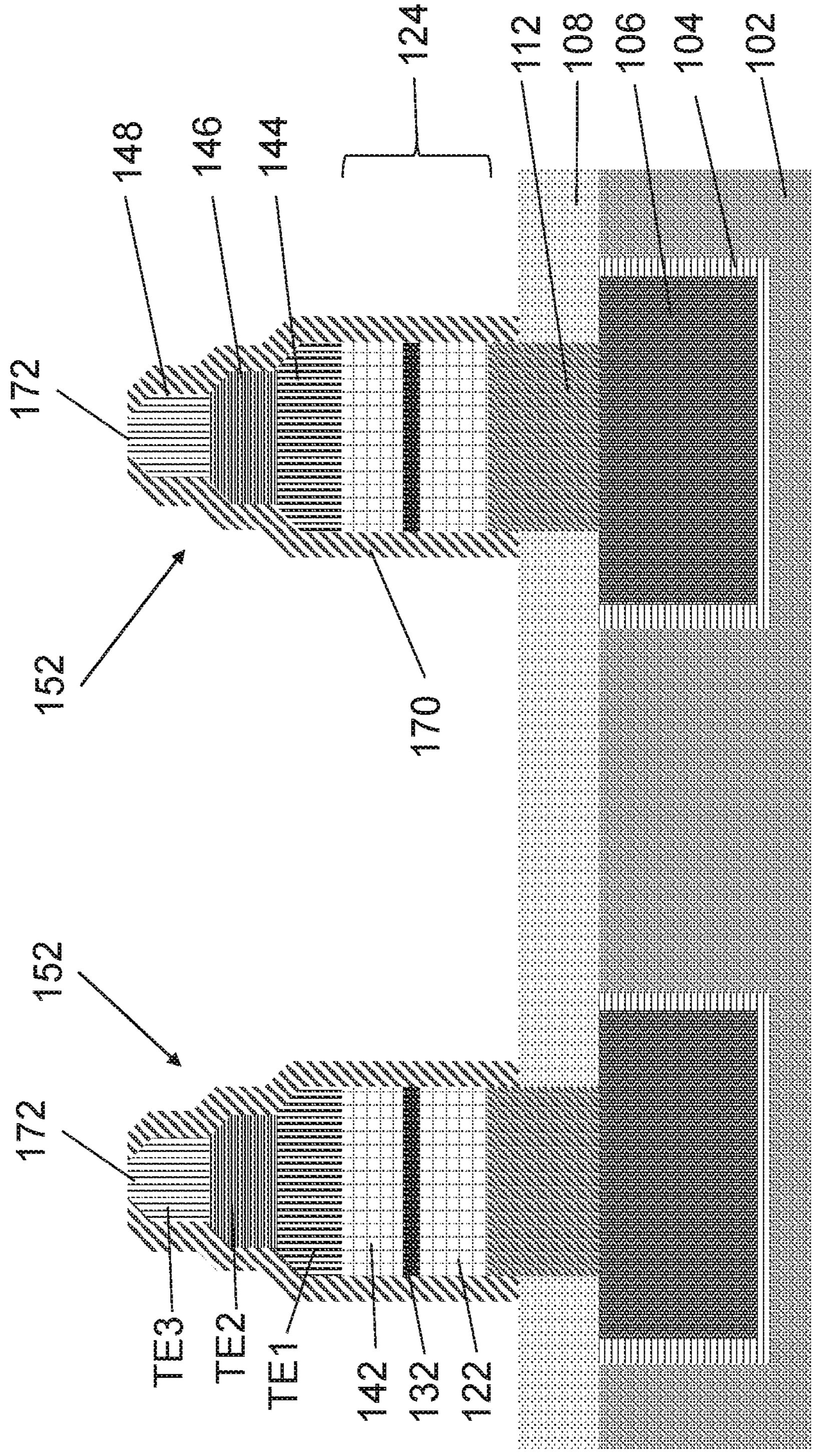
FIG. 10 is a cross-sectional view showing a spacer etch-back of the dielectric encapsulation layer to open a top portion and remover the dielectric encapsulation layer from horizontal surfaces in accordance with an embodiment of the present invention.

Referring to FIG. 10, a spacer etch process is performed to remove portions of the dielectric encapsulation layer 170 from a top portion 172 of the top electrode tier TE3 and from a surface of the dielectric cap layer 108. In one embodiment, the etch process may be an anisotropic etch process, such as, e.g., RIE or IBE.

Figure 11:
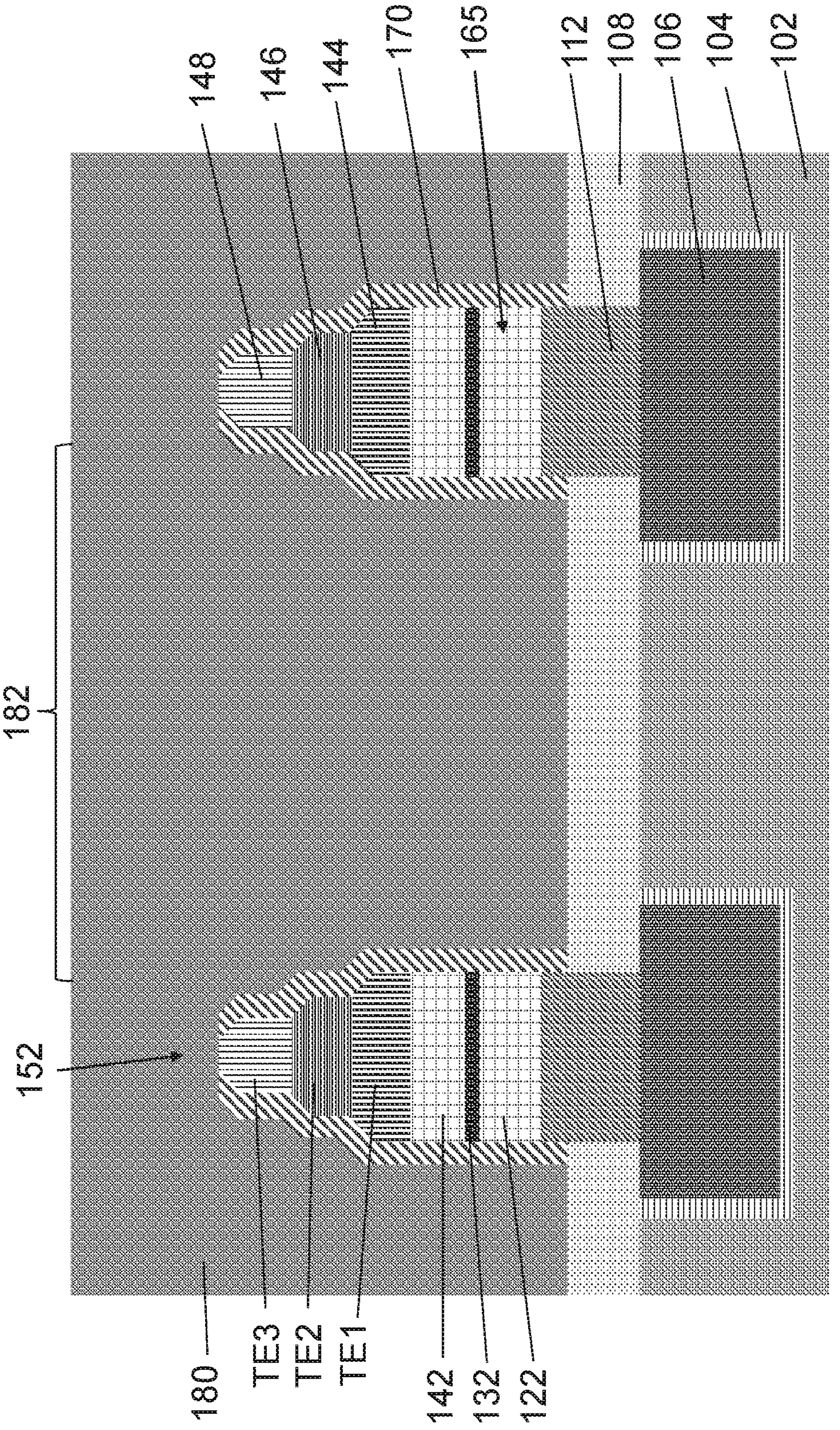
FIG. 11 is a cross-sectional view showing an interlevel dielectric layer formed over the pillar structures wherein adjacent pillar structures having top electrodes with recessed tiers provide space therebetween to reduce void formation in the space in accordance with an embodiment of the present invention.

Referring to FIG. 11, a dielectric layer 180, e.g., an interlevel dielectric layer (ILD), is deposited over the dielectric cap layer 108 and fills a gap between pillar structures 152. The dielectric layer 180 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 180 can be deposited using CVD, although other deposition methods can be employed.

The dielectric layer 180 fills a low aspect region 182 that includes a height and width between the pillar structures 152. Since the pillar structures 152 include laterally recessed top electrodes TE2 and TE1, there is less likelihood that voids will form in region or space 182 during the formation of the dielectric layer 180. This is because region 182 is easier and more reliably filled without voids forming in the dielectric layer 180. With no voids, there is little or no chance of conductive material being present between the pillar structures 152 during or after top contact formation in next steps. Since the deposition is shallower (e.g., lower aspect ratio), there is no gapfill concern between the pillar structures 152.

Figure 12:
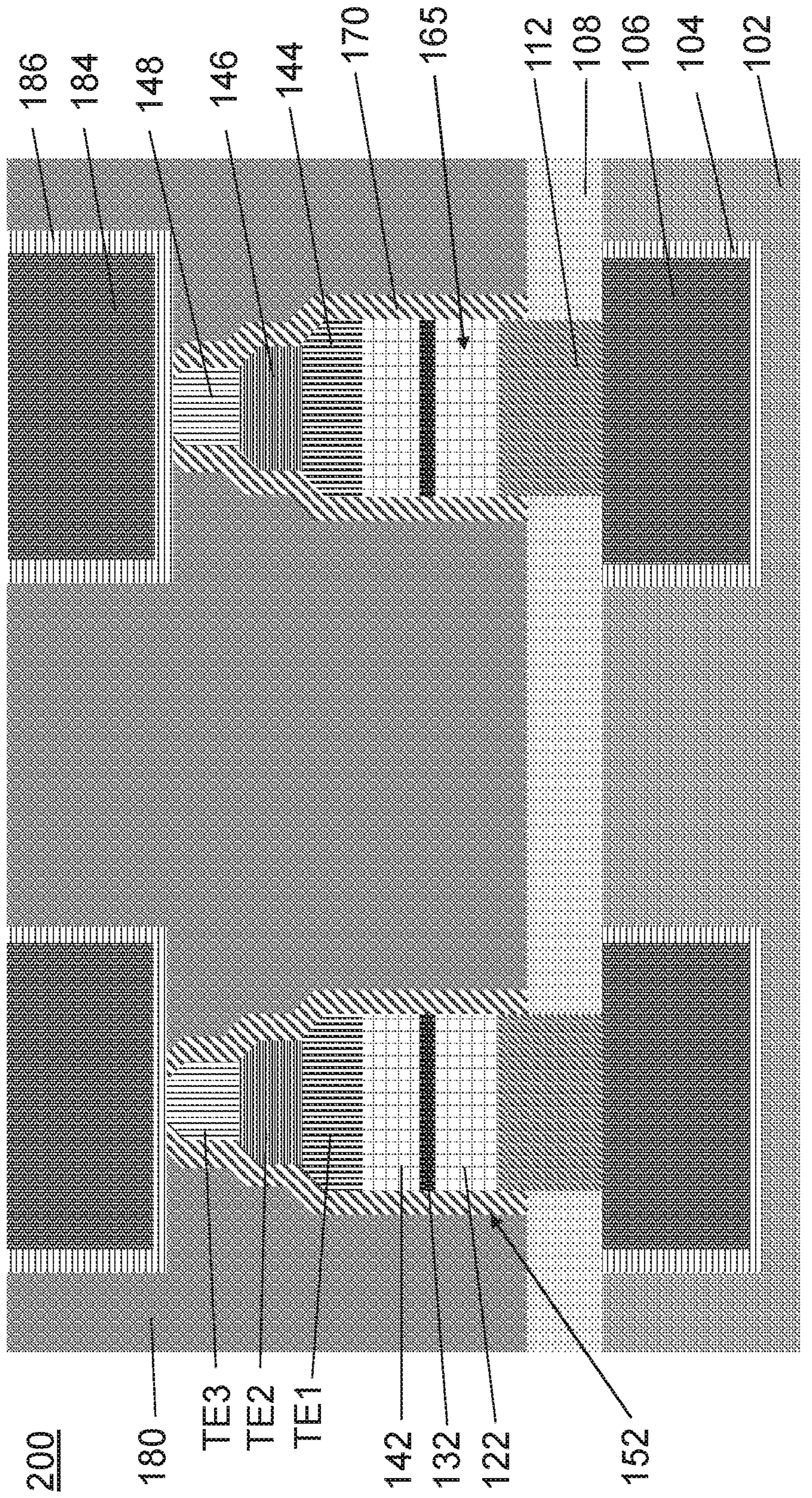
FIG. 12 is a cross-sectional view showing top conductors formed which contact the top electrodes in accordance with an embodiment of the present invention.

Referring to FIG. 12, a MRAM cell 200 is depicted in accordance with an embodiment of the present invention. The dielectric layer 180 is patterned and etched to form holes or trenches. The trench is then lined with a diffusion barrier or metal liner 184. The diffusion barrier 184 can be conformally deposited over the topography of the dielectric layer 180. The diffusion barrier 184 can be deposited by an atomic layer deposition (ALD) process, physical vapor deposition (PVD) or a CVD process, although other processes may be employed. The diffusion barrier 184 can include a material such as, e.g., TiN, TaN, TiWN, TaWN, HfN or the like.

A conductive fill is performed to fill the trenches on top of the diffusion barrier 184. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., CVD, PECVD, ALD or any other suitable deposition method.

A planarization process is performed, e.g., a chemical mechanical polish (CMP) to reduce the conductive fill to a surface of the dielectric layer 180 to form a top conductor 186. This CMP process also removes the diffusion barrier 184 from the surface of the dielectric layer 180. The top conductor 186 can include a metal line, a via or any other suitable conductive structure.

In one embodiment, the electrode tier TE1 and the bottom electrode 112 share a same footprint, and the tunnel barrier 132 shares this footprint. A footprint includes a horizontal area occupied by a structure. A footprint can refer to the horizontal area at any vertical height, e.g., within a pillar structure. It should be noted that that the top electrode includes three tiers, but two or more tiers can be employed in accordance with embodiments of the present invention.

Pillar structures 152 form memory storage portions of MRAM cells that can employ spin-transfer torque (STT) phenomenon realized in the MTJ 165, wherein a free layer (ferromagnetic layer 142) has a non-fixed magnetization, and the pinned or reference layer (ferromagnetic layer 122) has a fixed magnetization. The MTJ 165 stores information by switching the magnetization state of the free layer. A resistivity of the whole MTJ 165 changes when the magnetization of the free layer changes direction relative to that of the fixed layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The pillar structures 152 forming memory portions of MRAM cells are formed into arrays on a chip, which are connected by metal word and bit lines (e.g., conductors 106, 186). Each memory cell (associated with pillar structures 152) is connected to a word line and a bit line (e.g., conductors 106 and 186). The word lines connect rows of cells, and bit lines connect columns of cells. A selection transistor (not shown) can be electrically connected to the MTJ 165 through the top electrode tiers TE1-TE3 or bottom electrode 112.

The pillar structures 152 formed in accordance with embodiments of the present invention include a sidewall profile that is disrupted by a tiered top electrode (TE1-TE3). The recessed top electrode increases an amount of dielectric material between the electrodes of adjacent pillar structures 152 and makes a short much less likely as a result of increased isolation. In addition, a consistent and more uniform dielectric mass is formed between pillar structures 152 to prevent the possibility of void formation and therefore the possibility that such void would fill with conductive material during top contact (186) formation. Without gaps or voids, there is little possibility that conductive deposition of, e.g., the top electrode or other metal conductors could fill the voids with conductive material. The problem of shorting between top portions of MTJ pillars is greatly reduced or eliminated.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A magnetoresistive random access memory (MRAM), comprising:
a pillar structure having:
a bottom electrode;
a magnetic tunnel junction (MTJ) having a reference layer, a free layer and a tunnel barrier disposed between the reference layer and the free layer, the MTJ disposed on the bottom electrode; and
a top electrode disposed on the MTJ, the top electrode including at least two tiers wherein each tier successively includes a smaller footprint, wherein the at least two tiers include a first tier comprising a first conductive material and a second tier comprising a second conductive material different from the first conductive material, wherein the first conductive material and the second conductive material have different etch selectivities relative to each other.

2. The MRAM as recited in claim 1, wherein one of the at least two tiers of the top electrode has a footprint that is the same as a footprint of the tunnel barrier and a footprint of the bottom electrode.

3. The MRAM as recited in claim 1, wherein the top electrode includes three tiers.

4. The MRAM as recited in claim 3, wherein the three tiers comprise conductive materials including TaN, WCN and TiN.

5. The MRAM as recited in claim 3, wherein the three tiers comprise conductive materials including WN, MON and Mo.

6. The MRAM as recited in claim 1, wherein the top electrode includes etched corners to provide rounded or tapered features.

7. The MRAM as recited in claim 6, wherein the etched corners include tapers having an angle of between 15 and 30 degrees with respect to a vertical reference.

8. The MRAM as recited in claim 1, further comprising:
an interlevel dielectric layer disposed adjacent to the pillar structure; and
a top conductor extending through the interlevel dielectric layer and contacting an uppermost tier of the at least two tiers of the top electrode.

9. A magnetoresistive random access memory (MRAM), comprising:
a pillar structure having:
a bottom electrode;
a magnetic tunnel junction (MTJ) having a reference layer, a free layer and a tunnel barrier disposed between the reference layer and the free layer, the MTJ disposed on the bottom electrode; and
a top electrode disposed on the MTJ, the top electrode including three tiers wherein each tier is centered over the bottom electrode and successively includes a smaller footprint than a tier upon which each tier rests, wherein the three tiers include a first tier comprising a first conductive material and a second tier comprising a second conductive material different from the first conductive material, wherein the first conductive material and the second conductive material have different etch selectivities relative to each other.

10. The MRAM as recited in claim 9, wherein one tier of the three tiers of the top electrode has a footprint that is the same as a footprint of the tunnel barrier and a footprint of the bottom electrode.

11. The MRAM as recited in claim 9, wherein the three tiers comprise conductive materials including TaN, WCN and TiN.

12. The MRAM as recited in claim 9, wherein the three tiers comprise conductive materials including WN, MON and Mo.

13. The MRAM as recited in claim 9, wherein the top electrode includes etched corners to provide rounded or tapered features.

14. The MRAM as recited in claim 13, wherein the etched corners include tapers having an angle of between 15 and 30 degrees with respect to a vertical reference.

15. The MRAM as recited in claim 9, further comprising:

an interlevel dielectric layer disposed adjacent to the pillar structure; and a top conductor extending through the interlevel dielectric layer and contacting an uppermost tier of the three tiers of the top electrode.

16. A method for making a magnetoresistive random access memory (MRAM), comprising:

forming a bottom electrode and a magnetic tunnel junction stack;

forming at least two conductive material layers for a top electrode on the magnetic tunnel junction stack;

patterning the at least two conductive material layers using a hard mask to form a stack of conductive layers;

laterally recessing at least a top tier of the stack of conductive layers for the top electrode to reduce a footprint of the top tier relative to a tier below the top tier;

removing the hard mask; and forming a pillar structure with a magnetic tunnel junction by etching the magnetic tunnel junction stack in accordance with the top electrode, wherein the top electrode includes at least two tiers, wherein the at least two tiers include a first tier comprising a first conductive material and a second tier comprising a second conductive material different from the first conductive material, wherein the first conductive material and the second conductive material have different etch selectivities relative to each other.

17. The method as recited in claim 16, further comprising-corner rounding corners of the at least two tiers of the top electrode.

18. The method as recited in claim 16, further comprising conformally depositing an encapsulation layer to form electrical isolation on sidewalls of the pillar structure.

19. The method as recited in claim 16, wherein the at least two conductive material layers include three conductive material layers forming three tiers of the top electrode including the top tier, a middle tier, and a lower tier, and wherein the laterally recessing includes:

laterally recessing the top tier relative to the middle tier; and laterally recessing the middle tier relative to the lower tier.

20. The method as recited in claim 16, further comprising:

depositing an interlevel dielectric layer over the pillar structure and one or more adjacent pillar structures, wherein the pillar structure and the one or more adjacent pillar structures each include a respective top electrode with recessed tiers that provide one or more spaces therebetween to reduce void formation in the one or more spaces.

* * * * *